(12) United States Patent
Carrozzi et al.

(10) Patent No.: US 6,348,652 B1
(45) Date of Patent: Feb. 19, 2002

(54) FARADAY CAGE, PARTICULARLY FOR NUCLEAR MAGNETIC RESONANCE APPLICATIONS

(75) Inventors: Alessandro Carrozzi, La Spezia; Fabio Rezzonico, Como, both of (IT)

(73) Assignee: Esaote S.p.A., Casale Monferrato (IT)

( * ) Notice: Subject to any disclaimer, the term of this patent is extended or adjusted under 35 U.S.C. 154(b) by 0 days.

(21) Appl. No.: 09/427,748

(22) Filed: Oct. 27, 1999

(30) Foreign Application Priority Data

Nov. 26, 1998 (IT) .......................... SV98A0067

(51) Int. Cl.⁷ .............................. H05K 9/00; G01V 3/00
(52) U.S. Cl. .................... 174/35 MS; 324/318
(58) Field of Search .................. 174/35 R, 35 MS; 324/244, 318, 300

(56) References Cited

U.S. PATENT DOCUMENTS

| | | |
|---|---|---|
| 4,564,812 A | 1/1986 | Van Dijk |
| 4,613,820 A | 9/1986 | Edelstein et al. |
| 4,753,038 A | 6/1988 | Sohlström |
| 5,043,529 A | 8/1991 | Vanesky et al. |
| 6,255,823 B1 * | 7/2001 | Carrozzi et al. ............ 324/318 |

FOREIGN PATENT DOCUMENTS

| | | |
|---|---|---|
| CH | 666 076 | 6/1988 |
| DE | 19365 A1 | 4/1986 |
| DE | 40 11 660 | 10/1991 |
| EP | 0 503 106 A1 | 8/1991 |
| GB | 2 234 636 | 2/1991 |
| JP | 4-059349 | 2/1992 |

OTHER PUBLICATIONS

U.S. Patent application 09/427,759.
U.S. Patent application 09/427,758.

* cited by examiner

*Primary Examiner*—Jessica Han
(74) *Attorney, Agent, or Firm*—Burns, Doane, Swecker & Mathis, L.L.P.

(57) ABSTRACT

A Faraday cage, particularly for Nuclear Magnetic Resonance applications, has perforated peripheral walls in the form of gratings or networks and grounding elements, or elements having a predetermined potential with respect to the ground. The perforated or grated walls of the cage have a dark color at their inner side, preferably black or the like.

By this arrangement, a contrast is generated with the light coming from outside the cage, which causes a higher transparency effect, and reduces the risk of claustrophobic crises or sensations.

14 Claims, 6 Drawing Sheets

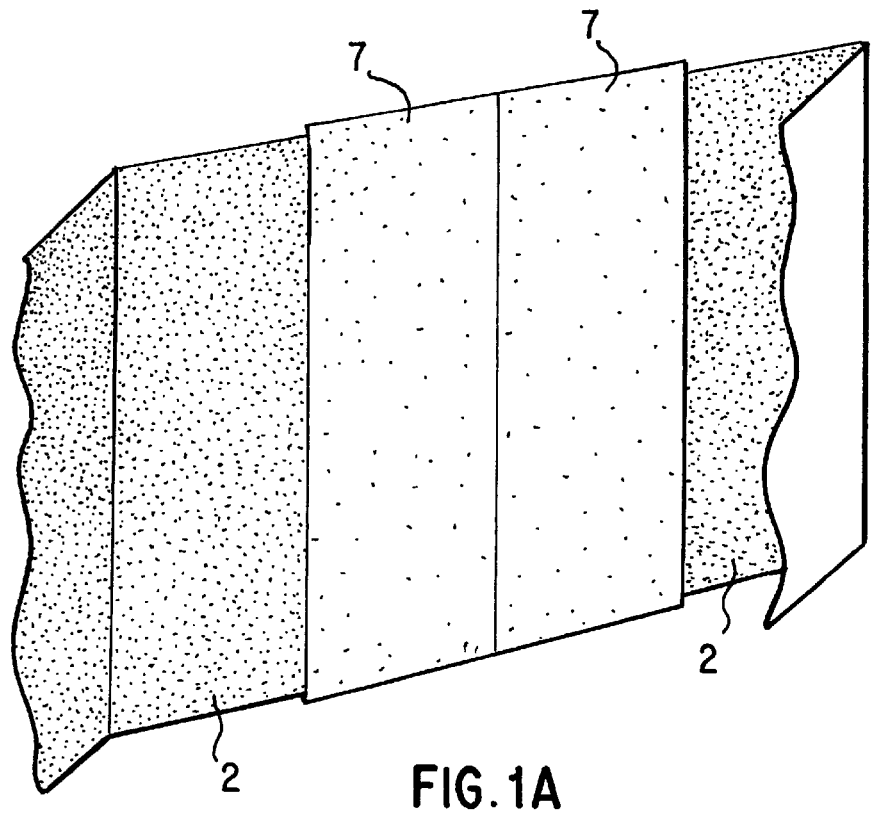
FIG. 1A
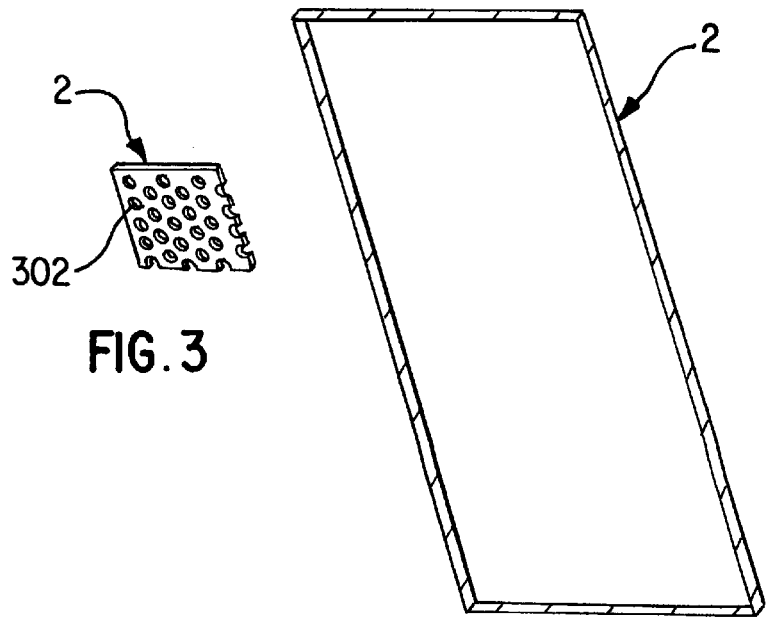
FIG. 3
FIG. 2

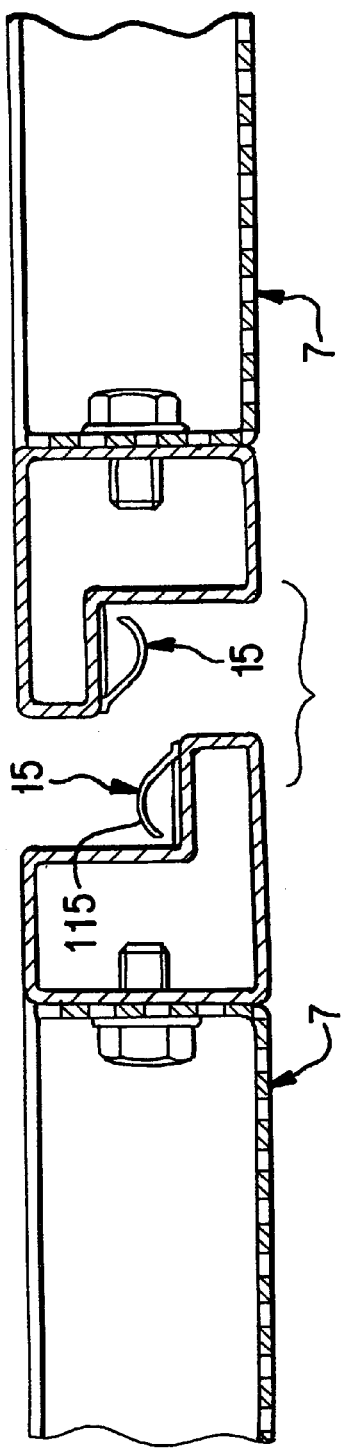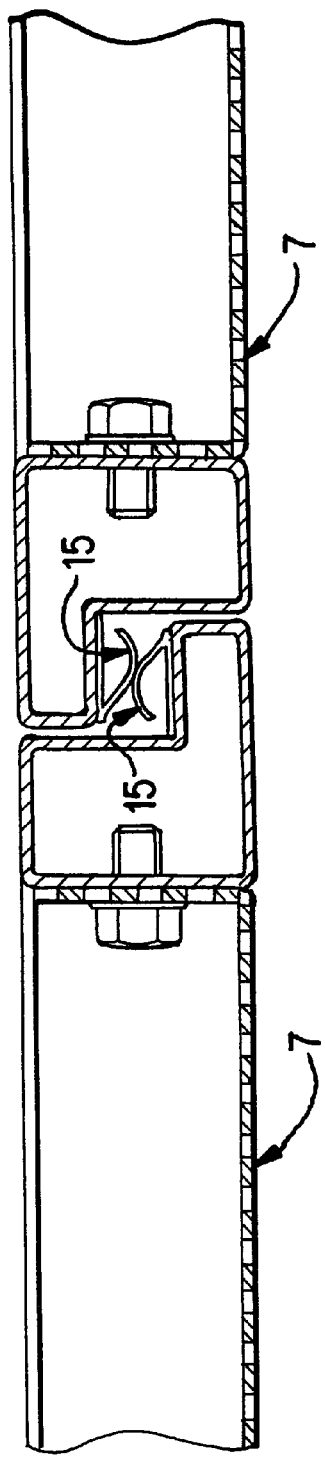

FARADAY CAGE, PARTICULARLY FOR NUCLEAR MAGNETIC RESONANCE APPLICATIONS

BACKGROUND OF THE APPLICATION

1. Field of the Invention

The invention relates to a Faraday cage, particularly for Nuclear Magnetic Resonance applications, having perforated peripheral walls in the form of gratings or networks and grounding means, or means having a predetermined potential with respect to the ground.

2. Description of Related Art

Faraday cages are well known and widely used in combination with Nuclear Magnetic Resonance imaging machines. Faraday cages are reliable means for suppressing electromagnetic noise. This is particularly needed in the so-called dedicated machines, which limit imaging to a few parts or a few areas of the anatomy. In these conditions, the patient body is at least partly outside the magnetic structure of the machine and acts as an antenna for electromagnetic radiation in the environment.

However, these cages typically consist of a room inside a room and are as small as possible, due both to cost and dimensional reasons. By using walls consisting of grates or networks, the problem of lighting up the inner part of the cage by external light sources and of venting the space enclosed in the cage by external or natural means is effectively solved. Nevertheless, the transparency to the eye of the person inside the cage is not sufficient to ensure that he/she will not be seized by clautrophobic crises or other psychological discomfort sensations.

Although various solutions have been proposed for suppressing electromagnetic noise, such as grounding the patient body and/or the medical staff by appropriate arrangements, or using self-shielding equipment, the best solution always includes a Faraday cage electromagnetic shield enclosing the equipment, the patient and possibly the medical staff. Hence, the need arises to provide more attractive Faraday cages.

OBJECTS AND SUMMARY

The invention has an object to provide, by using simple and comparatively inexpensive arrangements, a Faraday cage which provides an effective electromagnetic shield to ensure suppression of noise signals interfering with MRI, while reducing, even in a relatively small volume, the psychological effects on the patient in the cage, particularly improving the visual transparency effect of walls.

The invention achieves the above objects by providing a Faraday cage as described hereinbefore, wherein at least a part of the perforated or grated walls of the cage have a dark color at their inner side, preferably black or the like.

The cage may be composed of prefabricated parts which may be assembled without requiring building works and have a modular construction, allowing installation/dismantling with no masonry works.

The prefabricated parts may be made of an electrically conductive material, preferably metal, and be connected to each other by electrically conductive connection means, also preferably made of metal.

In accordance with a preferred embodiment, both lateral and ceiling walls of the cage, are provided, at least partly and at least for a part of their extension, with a plurality of apertures, whose size and arrangement on the surface depends on the required attenuation of electromagnetic noise.

In this case, at least a few noncritical areas may be provided in the form of continuous walls.

The above arrangements result in a considerable visual transparency, particularly when light sources were only placed outside the cage. Even in relatively poor external lighting conditions, the black color of the inner side of the cage allows, by contrast, a good visibility of the outside environment, thereby reducing the sensation of being enclosed in a confined space.

In equal conditions, the black or dark color allows to reduce the size and/or number of apertures in the wall thereby providing obvious advantages in terms of electromagnetic radiation shielding.

Advantageously, according to an improvement, the entrance doors may have, on its inner side, a color which differs markedly from the rest of the cage, particularly a light or white color, such as to allow an occupant to locate immediately the exit.

The provision of these apertures allows the patient to stay comfortably inside the cage, and to get over the discomfort caused by the necessarily long permanence inside confined rooms and/or situations, without limiting the function of the cage as an electromagnetic shield.

In accordance with an advantageous improvement, the cage may have, in combination with the doors, ceiling construction parts which can be opened and closed at the same time as doors.

Here advantageously, the doors are of the sliding type and extend to the ceiling, and are connected to the adjacent ceiling parts, at least one sliding guide, preferably two sliding guides, especially three sliding guides being provided, at the lower end of the door panel, at the upper end of the area connecting to the ceiling part and at the free end of the ceiling part opposite to the door panel.

The frame or the peripheral ledges of the door wings and/or the corresponding contact and/or abutment edges of the side frames may be provided with electric contact generating means along their extensions.

These electric contact generating means consist, at least partially and/or at least on the panel and/or at least on the side frame, of electric contact generating means which may be elastically stressed against the contact surface and/or wiping contact generating means.

These arrangements allow that the panel have a good electric continuity between themselves and between each of them and its respective side frame part, such that, in the closed condition, sufficient electric conductivity characteristics may be maintained. More particularly, the cage parts provided with entrances have the same shielding characteristics as all the other parts of the cage.

BRIEF DESCRIPTION OF THE DRAWINGS

The characteristics of the invention and the advantages derived therefrom will appear more clearly from the following description of a preferred embodiment, illustrated without limitation in the annexed drawings, in which:

FIG. 1A is a broken away view of the inner side of a portion of the Faraday cage shown in FIG. 1;

FIG. 2 is a perspective view of a modular construction part in the form of a plane rectangular panel.

FIG. 3 shows a detail of the panel surface as shown in FIG. 2.

FIG. 6 is a sectional view of the ledge area between wings, with the wings in a partially opened condition.

FIG. 7 is a view like that of FIG. 6, with the wings in the closed condition.

DETAILED DESCRIPTION OF THE PREFERRED EMBODIMENTS

Figure 1:
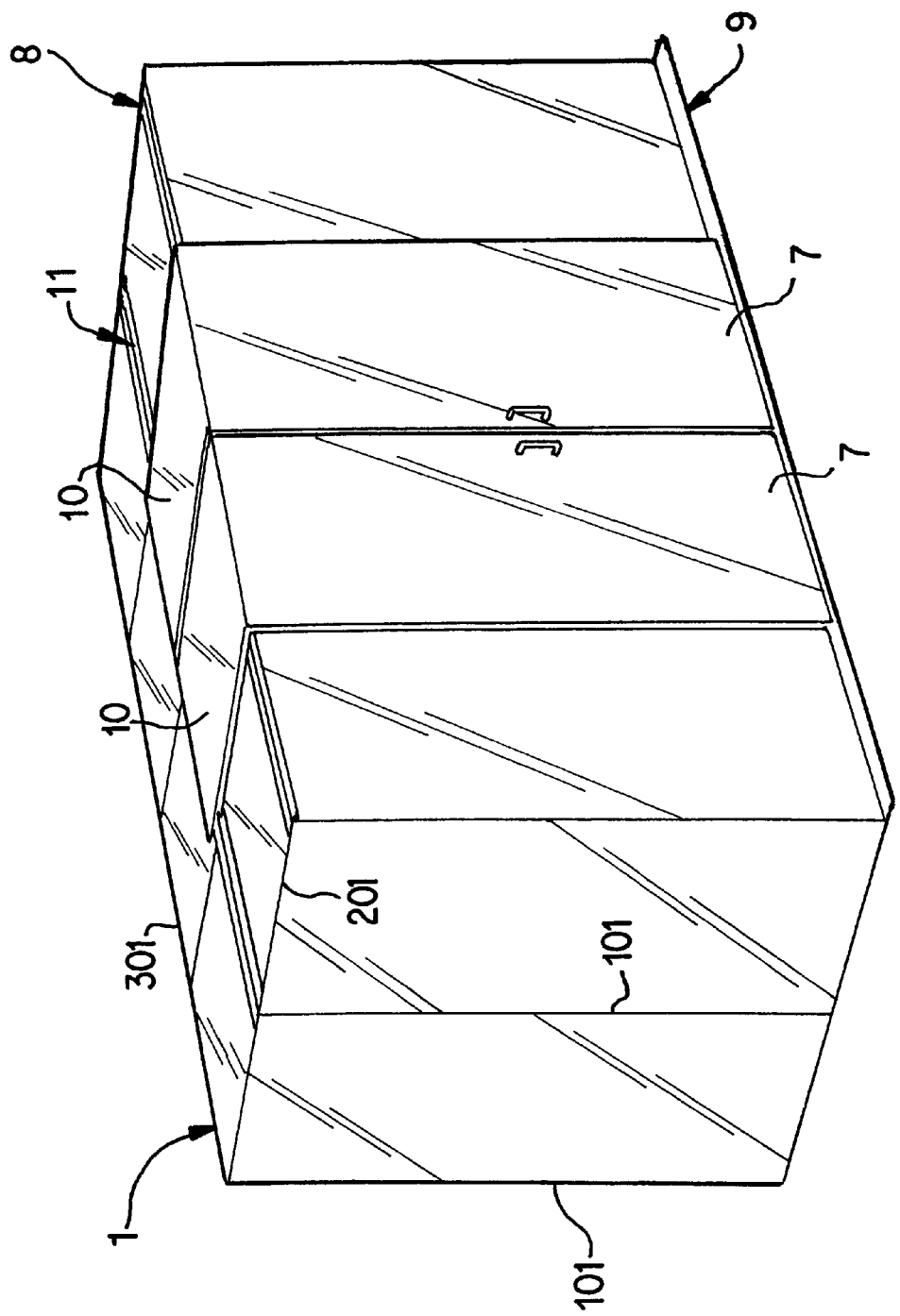
FIG. 1 is a perspective view of a preferred embodiment of the Faraday cage according to the invention, with the door wings in the closed condition.
Figure 4:
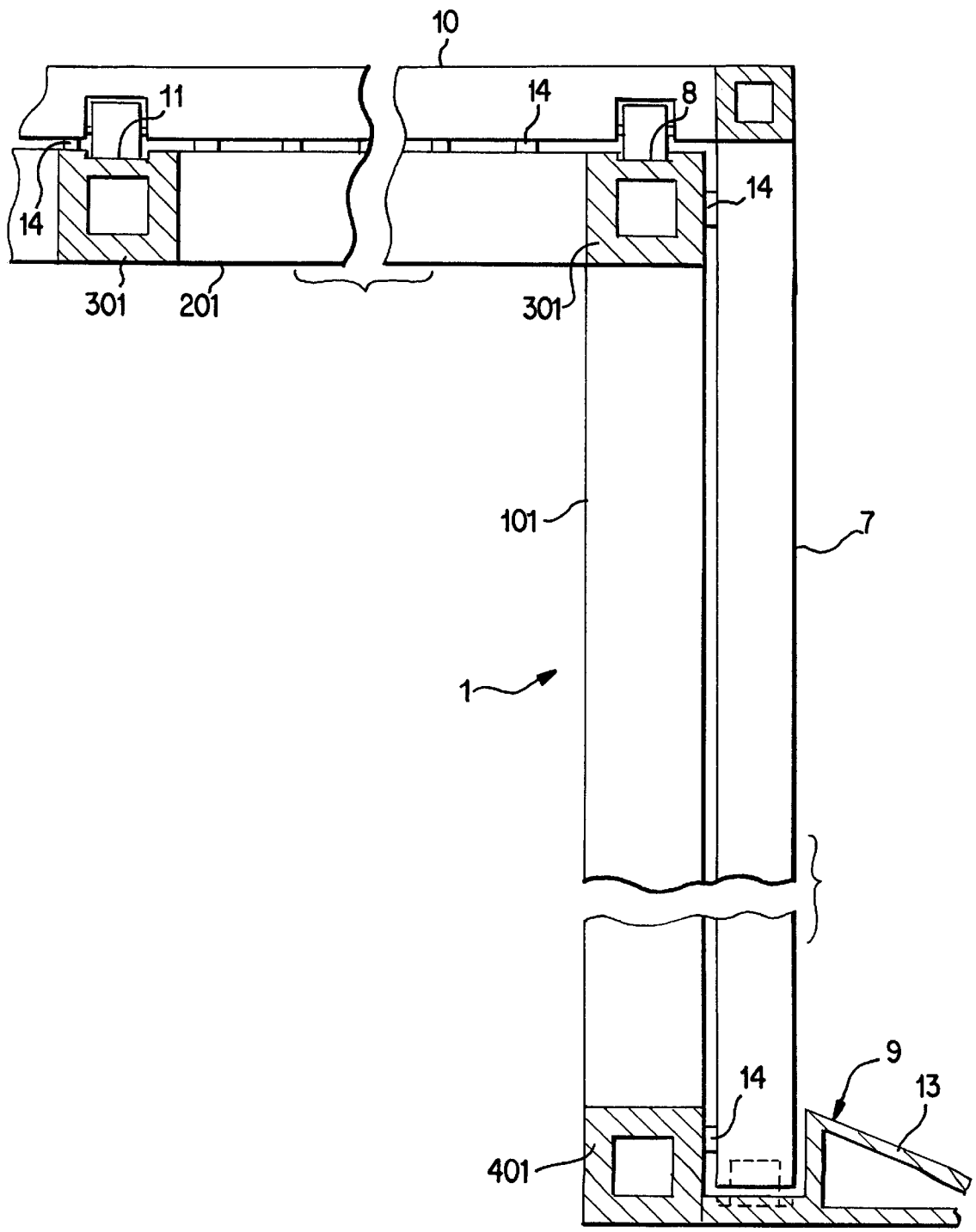
FIG. 4 is a vertical sectional view of the sliding locations of the door wings.
Figure 5:
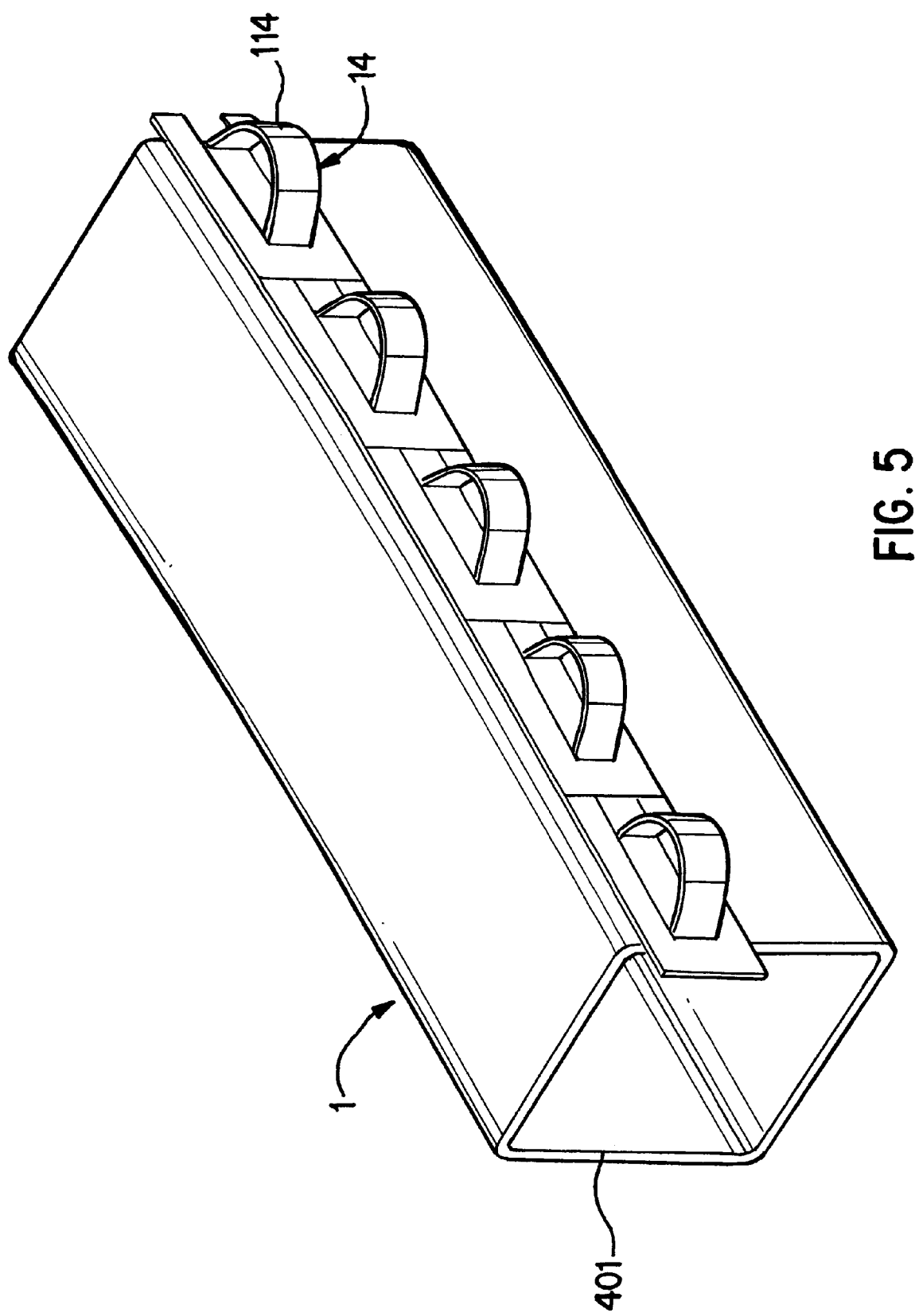
FIG. 5 is a perspective view of a detail of the elastic electric contact generating means of the wiping type, which is attached to the sliding guides for the wings and provided at the side frames and at the ledges of the doors abutting against the side frames and against each other.

With reference to FIG. 1, a preferred embodiment of the Faraday cage according to the invention comprises a structure 1, which is composed of metal walls with apertures, in the form of grates, networks, or the like.

Figure 8:
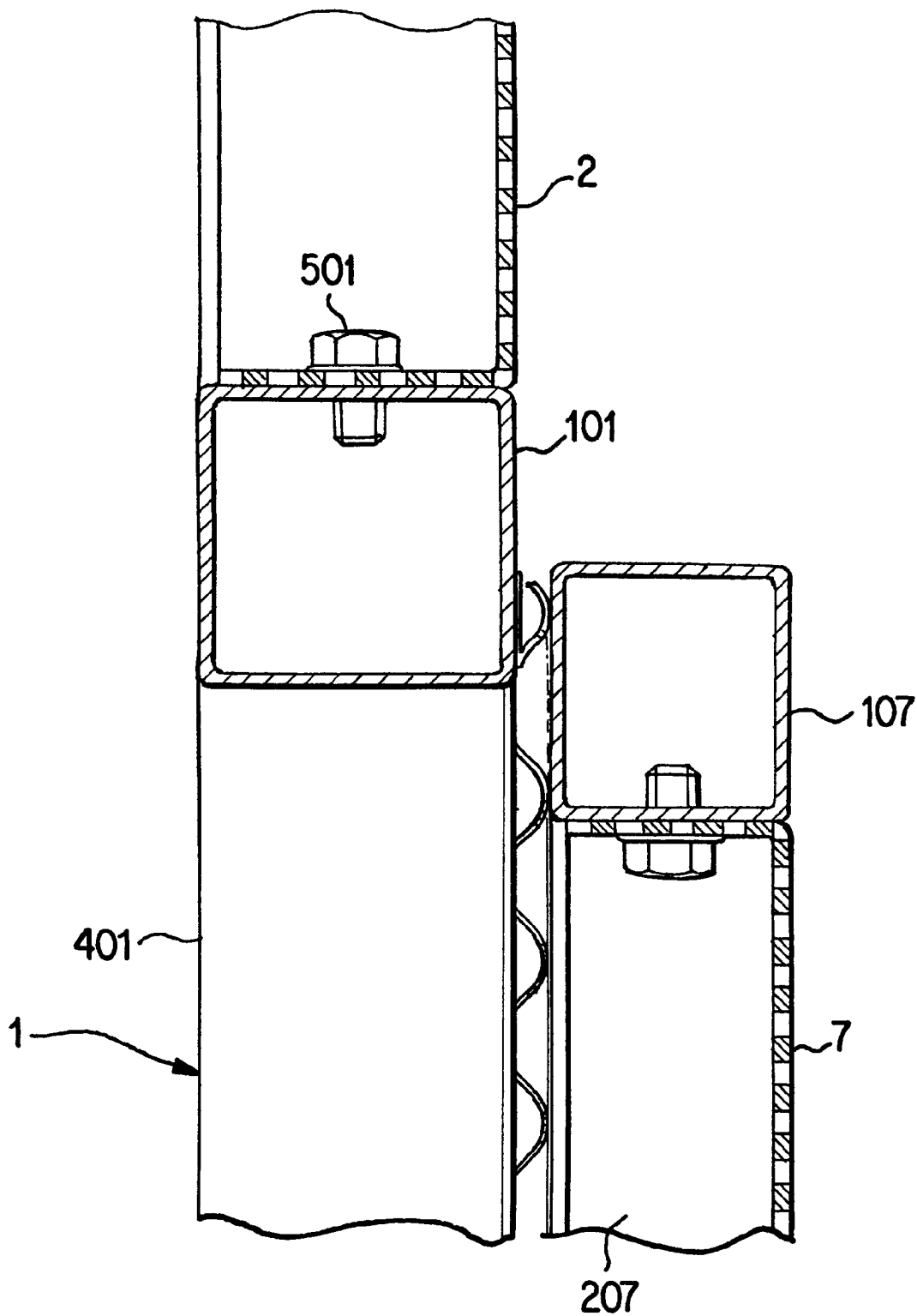
FIG. 8 is a sectional view of a detail of a wing in the closed condition, with respect to a horizontal plane.

Preferably, the structure 1 is composed of a plurality of uprights 101, crossbeams 201 and longitudinal members 301 which are made of metal and are mechanically fastened to each other, as well as connected electrically, preferably by the same mechanical fastening means, such as metal fastening bolts 501 or the like see FIG. 8. The walls include panels 2 which are fastened, as well as electrically connected to the uprights, crossbeams and longitudinal members 101, 201, 301, by means of the bolts 501.

All the walls of the cage, both side walls and ceiling walls, i.e. the corresponding panels 2, are provided with a plurality of apertures 302, which may be arranged all over the panels 2. However, the panels may also consist of a metal network or grating. The apertures 302 may have a diameter of 2 mm to 5 mm, preferably of 2.5 mm to 3.5 mm. The size of the apertures 302, or more generally the total open surface-to-total closed surface ratio will be such as to ensure a good air circulation, a good visibility from the outside, in combination with a desired electromagnetic noise suppression level.

The wall and ceiling panels have a dark color, preferably black or similar, possibly even opaque, on the inner side of the cage 1, On the outside surface, any color may be provided, while for doors a light or brighter color is preferred, so that they can be immediately recognizable in emergency conditions.

The cage according to the invention is provided with a double entrance door, consisting of two panels or wings 7 which provide the opening space for carrying in/out the equipment and the patient, even on a stretcher. Further, it can be also used when the door for entering the room which houses the cage is off-center with respect to the entrance door of the cage.

Advantageously, the panels wings 7 are preferably of the type which slides on guides, whereof one guide is at the top (8) and one is at the bottom (9). The panels 7 extend up to the ceiling of the cage, whereat they are connected to ceiling parts or panels 10, another guide 11 being provided, parallel to the guides 8 and 9 at the end of the ceiling panels 10 opposite to the corresponding panel 7.

The guides may be of whatever type sliding on rollers, and may also provide electric connection, thanks to their metal composition. The lower guide 9 is delimited inside by the floor frame part 401 and outside by another part 13. In the exemplary embodiment as shown, this part forms the threshold 13, and is slightly inclined downwards, having the function to connect the cage floor to the room floor which, for obvious reasons, are on slightly staggered planes.

Hence, the door panel 7 can be opened in a particularly smooth manner, thanks to the sliding system in use and to the fact that each panel 7 is suspended on the upper guide 8, and almost totally friction-free in the lower guide 9, which only has a retaining function. When the door panels 7 are opened, a part of the ceiling is also opened, which helps to ease the oppression for the patient entering the cage or to reduce the confinement sensation during the possible stop periods between an examination and another.

Obviously, opening and/or sliding systems differing from those shown herein, such as shutter doors or the like, might be provided.

Elastic electric contact generating means 14 of a first type are provided between the outer surfaces of the two parts 301, 401 and the corresponding inner surfaces of the panel frame parts 7.

As is shown, these means include of a succession of metal, preferably copper-plated, elements 14, each provided with an elastic outwardly arched blade 114, and arranged in such a way as to form a succession of yielding projections 114. These elastic means 14, in the embodiment as shown, are fixed on the parts 301, 401 of the structure 1, but may be also provided on the corresponding part of the door panel frame 7.

Elastic electric contact generating means 15 of a second type are also provided between the ledges of the two panels 7, as shown in FIGS. 6 and 7, and also between each panel 7 and the corresponding side frame post 101.

These means 15 are provided with lines of elastic metal, preferably copper-plated blades, having an arched shape and are provided on both opposite contact surfaces.

All the above elastic electric contact generating means 14, 15 have the function to ensure a good electric continuity between the door panels 7, and between the latter and the rest of the cage, when the panels 7 are in the closed condition. By choosing an entrance door with two rigid sliding panels 7 the additional advantage is provided that the number of surfaces to be electrically connected is reduced as compared with other prior art solutions.

The above contact blades or the possible different wiping contact generating means for electric connection to the cage and between the two panels are also provided at the peripheral edges of the movable ceiling parts 10, exactly as provided for the panels 7.

The result that a part of the ceiling is also opened has a positive psychological impact on anxious patients.

Moreover, in the example wherein the openable ceiling parts are made of one piece with the door panel 7, the guide at the inner semicircular part of the ceiling frame and the guide 9 at the lower end of the panels 7 may have such characteristics that the guide/s at the upper area of the panels 7 are totally absent.

Obviously, the invention is not limited to the embodiments described and illustrated herein, but may be greatly varied, especially as regards construction, e.g. by providing a cage which has a size and/or shape differing even considerably from the one described hereinbefore. Hence, for example, the movable ceiling panels 10 may also not be bound to the panels (7) of the door/s, and may be opened separately therefrom and/or together therewith by mechanical, electromechanical or electronic drive means, or the like. All this without departure from the guiding principle disclosed above and claimed below.

What is claimed is:

1. A Faraday cage, particularly for Nuclear Magnetic Resonance applications, comprising:

a plurality of perforated peripheral walls, and grounding means, or means having a predetermined potential with respect to the ground, wherein at least a part of the perforated walls of the cage have a dark color at an inner side, said dark color being sufficiently dark so as to improve a visual transparency effect of the walls to a user and thereby reduce the user's sensation of being enclosed in the Faraday cage.

2. The Faraday cage as claimed in claim 1, wherein the perforated peripheral walls include panels which are provided, at least partly and for a part of their extension, with a plurality of apertures, the size and arrangement of the apertures being selected based upon the required electromagnetic noise attenuation.

3. The Faraday cage as claimed in claim 1, wherein the dark color is black.

4. The Faraday cage as claimed in claim 1, wherein said plurality of perforated peripheral walls are in the form of gratings or networks.

5. The Faraday cage as claimed in claim 1, further comprising door panels and members for generating electric contact between a frame of the cage and the door panels, and further comprising members for generating electric contact between the panels of the door along their peripheral edges.

6. The Faraday cage as claimed in claim 1, further comprising guides and door panels of the type which slide on the guides, whereof one of the guides is at the top of the cage and one of the guides is at the bottom of the cage, and said guides are, at least partially, in a ceiling and/or floor framework.

7. The Faraday cage as claimed in claim 6, wherein the guides include elastic means for making electric contact between the top guide, the bottom guide and a corresponding part of the door panels.

8. The Faraday cage as claimed in claim 1, further comprising ceiling panels and door panels, wherein the ceiling panels are provided on a plane which is above the corresponding door panels, and the ceiling panels are each fixed to the corresponding door panel, and may be opened/closed when the door panels associated thereto are opened/closed.

9. The Faraday cage as claimed in claim 8, wherein the ceiling panels are slidably mounted, at a side opposite to the associated door panel, in a guide, there being provided elastic means for generating electric contact with the cage, and there being also provided electric contact generating means at the mutual contact surfaces between the movable ceiling panels.

10. The Faraday cage as claimed in claim 8, wherein the ceiling panels associated to the openable door panels are integral with the door panels, while a further supporting slide guide may be provided in the junction area between the door panels and the associated ceiling panels.

11. The Faraday cage as claimed in claim 8, wherein the ceiling panels may slide separately from the door panels, there being provided a slide guide along the contact edge between the door panels and the ceiling panels, which forms a top slide guide for the door panels and a front slide guide for the ceiling panels.

12. The Faraday cage as claimed in claim 1, wherein the cage has at least one door which, at least on the inner side has a different color with respect to a remainder of the cage.

13. The cage as claimed in claim 12, wherein the door has a color on the inner side that is lighter than the remainder of the cage.

14. The Faraday cage as claimed in claim 12, wherein the door has a different color on the outer side than a remainder of the cage.

\* \* \* \* \*